United States Patent [19]

Noda

[11] Patent Number: 5,057,883
[45] Date of Patent: Oct. 15, 1991

[54] PERMEABLE BASE TRANSISTOR WITH GATE FINGERS

[75] Inventor: Minoru Noda, Itami, Japan

[73] Assignee: Mitsubishi Denki Kabushiki Kaisha, Japan

[21] Appl. No.: 463,478

[22] Filed: Jan. 11, 1990

[30] Foreign Application Priority Data

May 10, 1989 [JP] Japan .................. 1-117694

[51] Int. Cl.$^5$ ...................... H01L 29/80; H01L 29/06
[52] U.S. Cl. .......................... 357/22; 357/55
[58] Field of Search .............. 357/22 E, 22 I, 20, 357/55, 4, 20, 22 F

[56] References Cited

U.S. PATENT DOCUMENTS

| 4,463,366 | 7/1984 | Ishii et al. | 357/22 I |
| 4,583,107 | 4/1986 | Clarke | 357/20 |
| 4,724,223 | 2/1988 | Ditchek | 357/22 |

OTHER PUBLICATIONS

Howes et al, "Gallium Arsenide", John Wiley & Sons, 1986, pp. 420-421.
Rathman et al, "The Effect of Base-Schottky ... Performance", IEEE Electron Device Letters, vol. EDL-5, No. 6, Jun. 1984, pp. 191-193.
Mishra et al, "Short-Channel Effects ... Investigation", IEEE Electron Device Letters, vol. EDL-4, No. 4, Apr. 1983, pp. 125-127.
Adachi et al, "A New Gate ... FET", IEEE Electron Device Letters, vol. EDL-6, No. 6, Jun. 1985, pp. 264-266.

Primary Examiner—William Mintel
Assistant Examiner—Roy Potter
Attorney, Agent, or Firm—Leydig, Voit & Mayer

[57] ABSTRACT

A permeable base transistor includes a source region and a drain region confronting each other in a semi-insulating semiconductor layer, a gate electrode having a current penetrating aperture through which a channel current flows disposed between the source region and the drain region and the source and drain regions, and the gate electrode are disposed so that the channel current flows transverse to the thickness of the semi-insulating semiconductor layer.

15 Claims, 6 Drawing Sheets

PERMEABLE BASE TRANSISTOR WITH GATE FINGERS

FIELD OF THE INVENTION

The present invention relates to a permeable base transistor (hereinafter, referred to as PBT) and, more particularly, to a structure where a channel current flows in a direction transverse to the substrate thickness.

BACKGROUND OF THE INVENTION

Figures 2A, 2B, 2C:
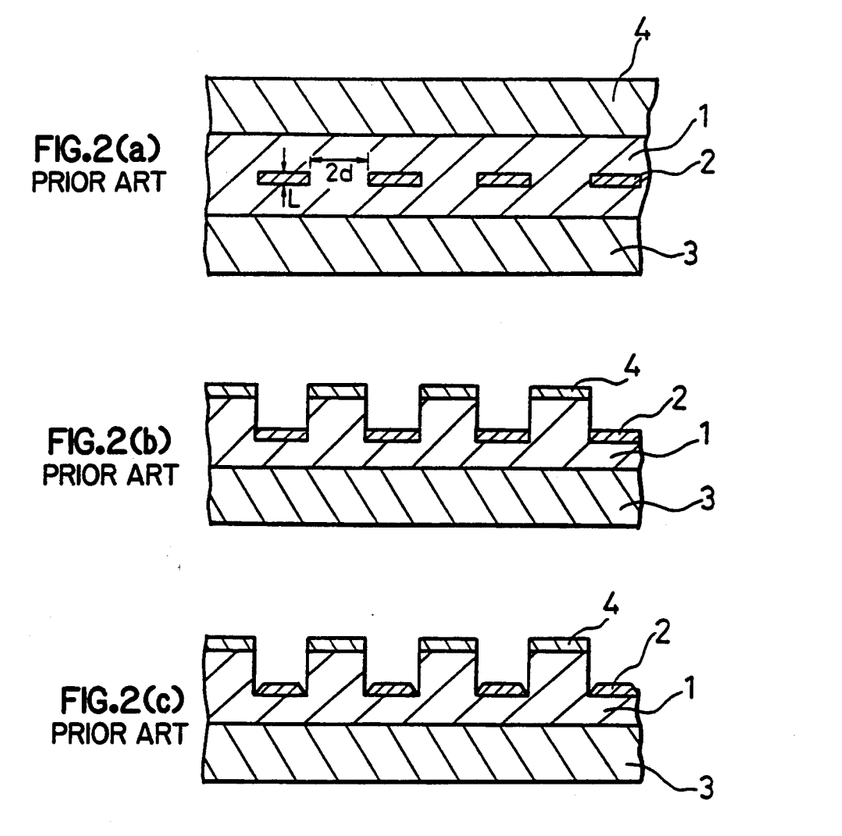
FIGS. 2(a) to 2(c) are diagrams showing cross-sectional views of prior art PBT structures, respectively.

FIG. 2(a) shows a cross-sectional view of a prior art buried type PBT. In FIG. 2(a), reference numeral 3 designates a source (emitter) n+ semiconductor layer. An n+ substrate or an epitaxially grown layer is used for this source layer 3. A channel layer 1 is epitaxially grown on the source n+ semiconductor layer 3. A drain (collector) n+ semiconductor layer 4 is disposed on the channel layer 1. Gates (bases) 2 comprising a grating of a Schottky barrier metal are arranged centrally in the channel layer 1. Gate depletion layers are broadened in a region at the neighborhood of gates 2 during transistor operation.

FIGS. 2(b) and 2(c) show cross-sectional views of a prior art dug side wall type PBT and a prior art dug edge type PBT, respectively. In the digged side wall type PBT in FIG. 2(b), grooves reaching the central portion of channel layer 1 from the surface of drain layer 4 are produced and gates 2 are disposed in the grooves. In the dug edge type PBT shown in FIG. 2(c), gates 2 are disposed in the grooves and the gates 2 are processed to produce a trapezoidal cross-sectional configuration.

Although the cross-sectional structures of above-described PBTs are different from each other, in all PBTs, the base region including a grating of thin-film Schottky metal gates and a current permeable channel portion, and the operating current (channel current) flows in the vertical direction, that is, transverse to the substrate thickness.

The main operation thereof is as follows. When an input control signal is applied to the Schottky metal gate as a base, the gate depletion layer is modulated, whereby the gate current at the channel is modulated.

These PBTs have operational characteristics as in the following.

1) Since the base region is a longitudinal type structure in which the channel current flows in the substrate thickness direction, the thickness of the gate metal corresponds to the gate length, whereby quite short gate lengths of about 0.1 micron can be easily realized. A super high frequency operation is expected in the device of such a longitudinal type structure.

2) Since the active layer between the drain and source layer is produced by an epitaxial growth method, the film thickness is as thin as about 0.2 to 0.5 microns. In a compound semiconductor including charge carriers having a small effective mass, such as GaAs, ballistic electronic conduction arises in such thin active layer, thereby reducing gate propagation delay. This results in super high speed operation.

3) Since the input control signal is applied to the gate depletion layer capacitance through the gate metal, the loss due to parasitic resistances is less than with bipolar transistors in which the input control signal is applied through the base.

4) In a structure where the n+ substrate is used for the source n+ layer, grounding with a quite small amount of inductance can be realized, thereby resulting in a transistor which is suitable for a high frequency and high power operation.

In the prior art longitudinal type PBT structure, however, since the gate electrode 2 is positioned at the central portion of the channel layer 1 as an epitaxial growth layer as shown in FIG. 2(a), the quality of semiconductor crystal is poorer at the upper half portion of channel layer 1, resulting in difficulty in increasing the breakdown voltage. Furthermore, in the PBT structures shown in FIGS. 2(b) and 2(c), although the deterioration of crystallinity is not a great problem because no semiconductor layer is disposed on the gate electrode 2, separation of the gate electrode 2 from the drain electrode 4 is structurally difficult.

SUMMARY OF THE INVENTION

It is an object of the present invention to provide a permeable base transistor preventing the deterioration of the quality of the semiconductor crystal in the neighborhood of the gate (base) electrode, and appropriate for producing a transistor structure with high controllability and reproducibility.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a permeable base transistor is provided with a source n+ layer and a drain n+ layer which are disposed in a semi-insulating semiconductor layer perpendicular to the thickness direction of the semi-insulating and a layer gate electrode grating is disposed between the source and drain n+ layers, thereby enabling the flow of an operational current in the transverse direction, that is, in the direction perpendicular to the substrate thickness. Therefore, a channel layer can be produced without growing an epitaxial layer on the gate electrode as in the prior art longitudinal type PBT structure, and deterioration of the crystallinity of the epitaxially grown channel layer in the neighborhood of gate electrode is prevented.

Furthermore, since the drain layer and the gate electrode are arranged in a longitudinal direction with a predetermined distance therebetween, there is no necessity of separating the gate electrode and the drain electrode in the transverse direction, thereby avoiding the problem that the gate electrode and the drain electrode cannot be completely separated. This results in an enhancement of transistor performance and production yield.

DETAILED DESCRIPTION OF THE PREFERRED EMBODIMENTS

An embodiment of the present invention will be described in detail with reference to the drawings.

Figure 1A:
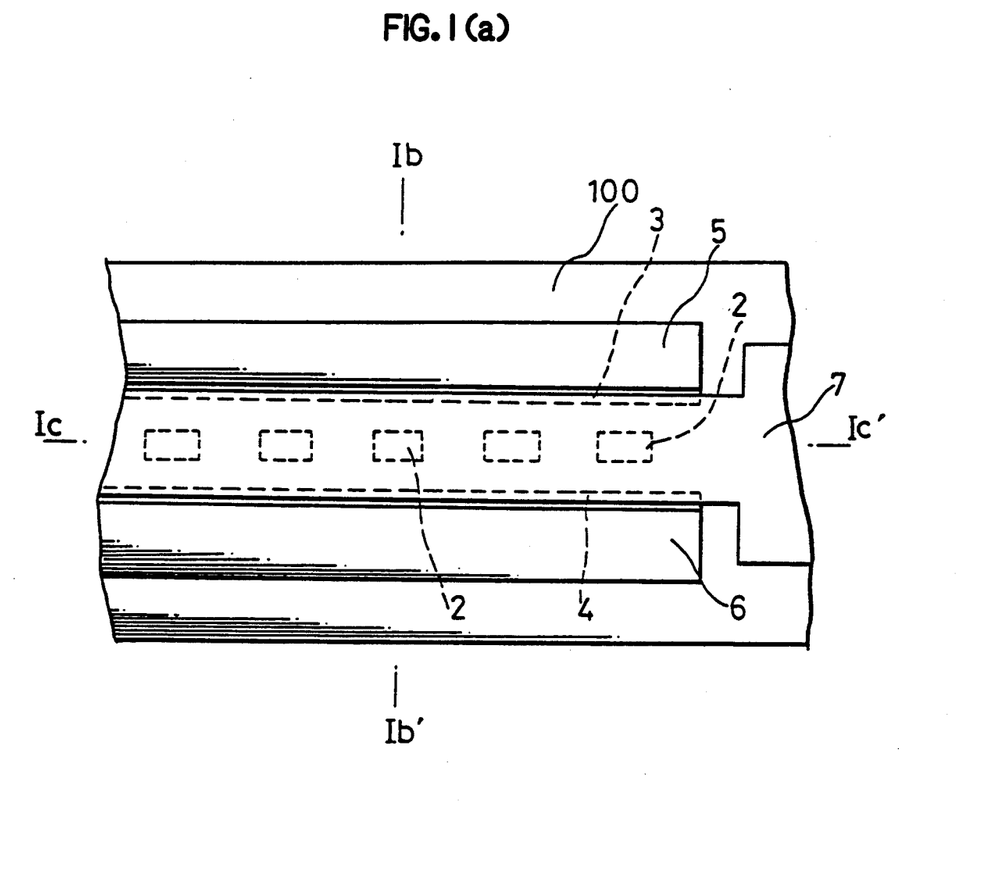
FIGS. 1(a) to 1(c) are a plan view and two cross-sectional views of a PBT according to a first embodiment of the present invention.
Figure 1B:
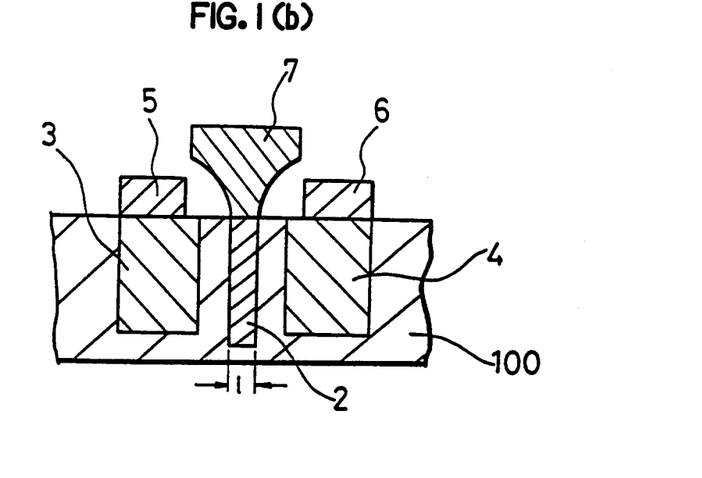
Figure 1C:
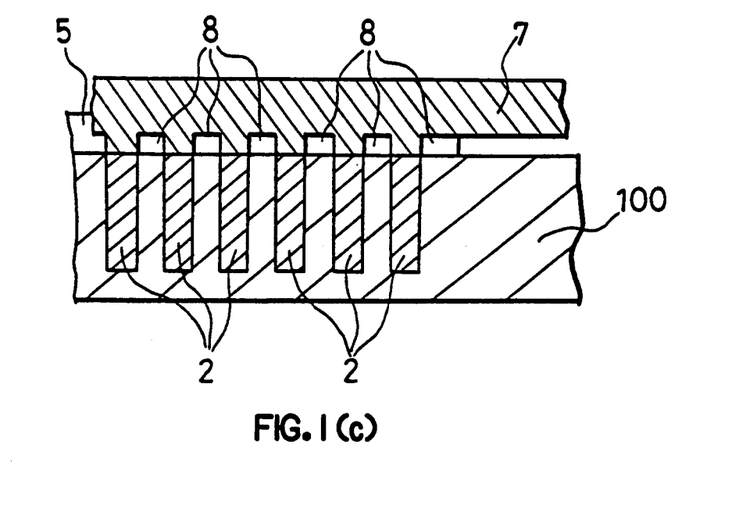

FIGS. 1(a) to 1(c) show a PBT according to a first embodiment of the present invention. FIG. 1(a) shows a plan view of the PBT, the FIG. 1(b) shows a cross-section taken along line Ib—Ib' parallel to the channel direction of FIG. 1(a), and FIG. 1(c) shows a cross-section taken along line Ic—Ic' perpendicular to the channel direction of FIG. 1(a). In FIG. 1, reference numeral 100 designates a semi-insulating GaAs substrate having a charge carrier concentration of $10^{14}$ to $10^{16}$ cm$^{-3}$ at most. A source n+ region 3 and a drain n+ region 4 are disposed in the substrate 100 opposing each other. A buried gate (base) electrode 2 of a finger configuration a metal or low resistance semiconductor layer is disposed in a region between the source and drain n+ regions 3 and 4. The finger configuration includes metal gate fingers with intervening apertures, the current permeable apertures of the PBT. A source electrode 5 and a drain electrode 6 are disposed on the source n+ region 3 and the drain n+ region 4, respectively. A gate contacting electrode 7 is disposed opposite the substrate 1 and connected with the buried gate electrode 2. Spaces 8 may be disposed between adjacent gate buried electrodes 2 as shown in FIG. 1(c) so that the gate contacting electrode 7 does not directly contact the substrate 1. These spaces 8 are not necessarily required.

The buried gate electrodes 2 extend over several hundred microns length with intervals of about 0.1 to 10 microns between adjacent electrodes, along the longitudinal direction of the source and drain regions. The gate length is less than 0.5 micron (5000 angstroms). The depth of the source and drain n+ layers 3 and 4 are more than several microns so that the driving current is equivalent to that of the prior art longitudinal type PBT structure.

In the PBT structure of this embodiment, although the principal of operation is the same as that of the prior art PBT, the channel current flows between the source n+ layer 3 and the drain n+ layer 4 in the direction transverse to the substrate thickness.

The production method of the PBT of this embodiment will be described with reference to FIG. 3(a) to 3(i).

Figure 3A:
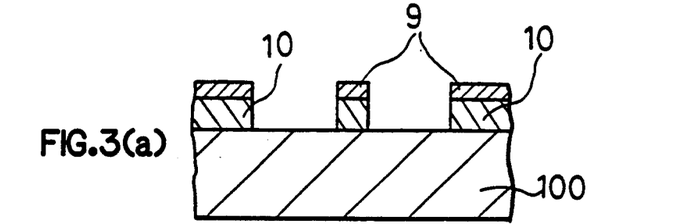
FIGS. 3(a) to 3(h) are cross-sectional views and FIG. 3(i) is a plan view of process steps for producing the PBT embodiment of FIG. 1.

First of all, as shown in FIG. 3(a), a first insulating film is deposited on the entire surface of a semi-insulating GaAs substrate 100 and is patterned with the first photoresist film 9, thereby producing an insulating pattern 10 for producing source and drain n+ layers. The width of the pattern 10 is established such that the interval between the source and drain n+ layers 3 and 4 is less than about 0.5 micron.

Figure 3B:
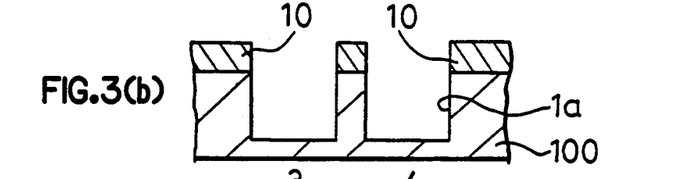
Figure 3C:
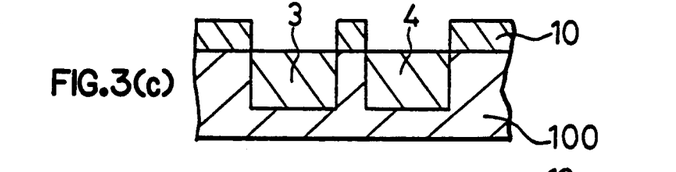
Figure 3D:
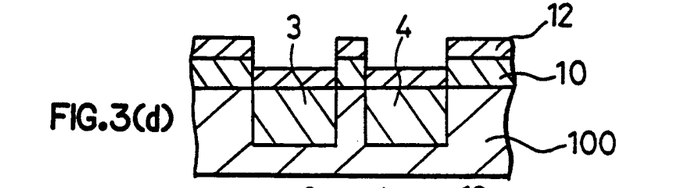

Next, as shown in FIG. 3(b), the GaAs substrate 100 is selectively etched in excess of several microns using the insulating film pattern 10 as a mask. Thereafter, as shown in FIG. 3(c), the source and drain n+ layers 3 and 4 are epitaxially grown in the etched portion 1a. Subsequently thereto, as shown in FIG. 3(d), a second insulating film 12 of a different kind from the insulating film pattern 10 is deposited on the entire surface. Then, the pattern 10 is removed which removes the second insulating film 12 which is disposed thereon, thereby selectively and self-aligningly leaving second insulating film 12 on the n+ epitaxial layers 3 and 4.

Figure 3E:
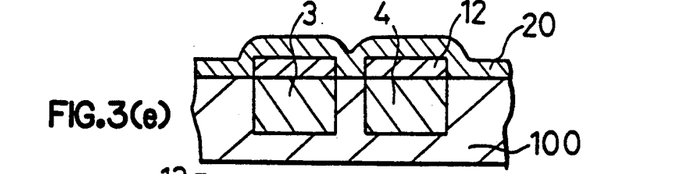
Figure 3F:
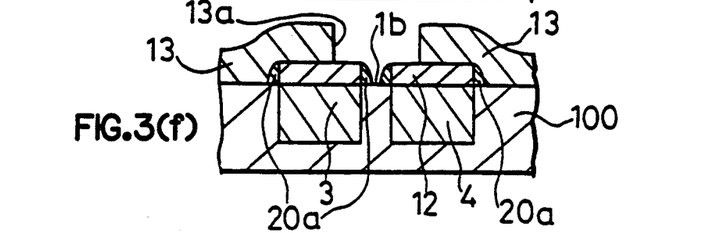

Next, as shown in FIG. 3(e), a third insulating film 20 of the same kind as the insulating film pattern 10 is deposited on the entire surface. Then, as shown in FIG. 3(f), the insulating film 20 is etched to level side walls 20a at the side walls of the insulating film 12 on the epitaxial layers 3 and 4. The GaAs surface is exposed at 1b to a width below 0.5 micron (typically below 0.1 micron width) self-alignedly between the side walls 20a between insulating films 12. Thereafter, a second photoresist film 13 is deposited on the entire surface, and is patterned to produce an aperture 13a having larger width than the exposed portion 1b of substrate 100. This photoresist pattern 13 includes portions 13b, as shown in FIG. 3(i), that result in the spaces 8 in the PBT as shown in FIG. 1(c).

Figure 3G:
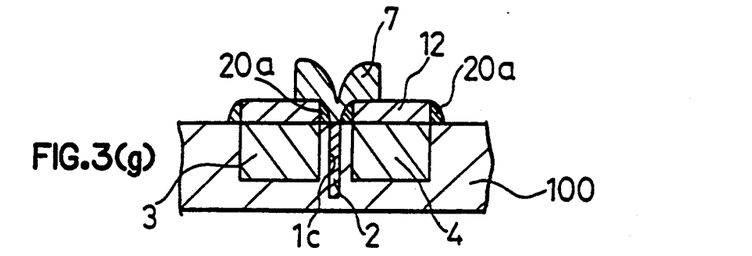
Figure 3H:
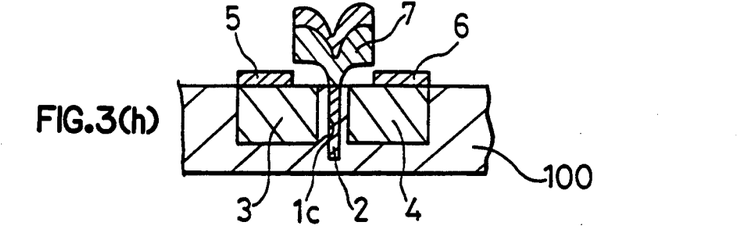
Figure 3I:
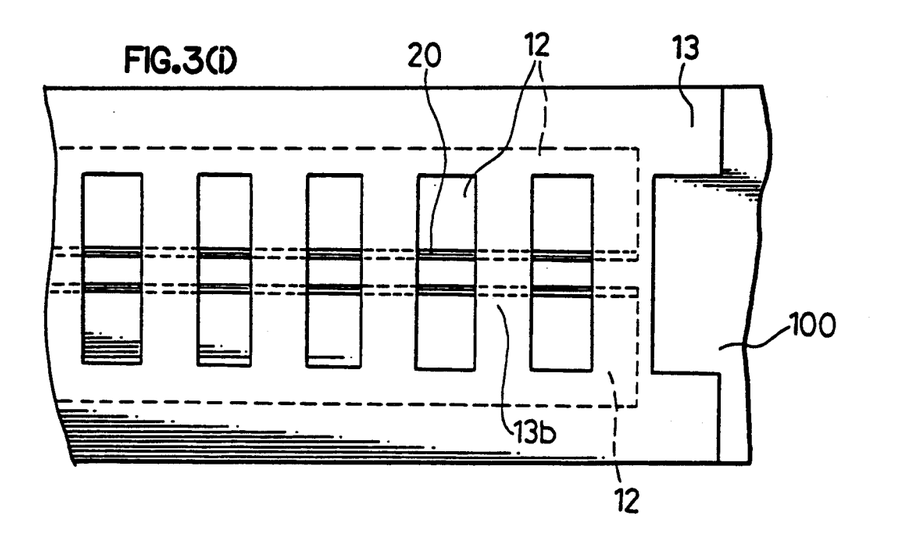

Next, as shown in FIG. 3(g), the GaAs exposure portions 1b, regions for burying the gate electrode material, are etched to more than several microns in depth to produce pits 1c. A gate metal is selectively deposited in the pits 1c by sputtering, or vapor deposition. Thereafter, a gate contacting electrode metal 7 is deposited by sputtering or vapor deposition using the photoresist film 13 as a mask. Finally, as shown in FIG. 3(h), the second insulating film 12 and the side walls 20a are removed, and a source electrode 5 and a drain electrode 6 are self-alignedly produced using a evaporation method.

The PBT of this embodiment is substantially different from the prior art PBT in that the source region 3, the drain region 4, and the gate buried electrodes 2 are arranged such that the channel current flows in a direction transverse the substrate thickness. By adopting such arrangement, the buried gate electrodes 2 can be produced in the pits 1c of the substrate 100, and a channel layer is not an epitaxial layer on the buried gate electrode but a semi-insulating bulk crystalline substrate. Therefore, since there is no necessity of producing an epitaxial growth channel layer on a gate, the deterioration of crystallinity in the neighborhood of the gate, that is, the characteristic deterioration due to the epitaxial growth is absent. This results in a higher performance PBT having a higher breakdown voltage and producing ballistic electronic conduction.

Furthermore, since the drain layer and the gate electrode are arranged in a longitudinal direction relative to the substrate with a predetermined distance therebetween, faulty separation between the gate electrode and the drain electrode can be avoided, thereby improving the controllability of the production of the PBT.

Furthermore, since this PBT has a transverse type structure, the production process is compatible with that of FETS. That is, there is a high possibility of realizing an IC in which both a PBT and FET are fabricated.

While in the above-illustrated embodiment, the gate contacting electrode is after producing the buried gate, the gate electrode and the contacting buried gate may be produced at the same time. Furthermore, the substrate is not restricted to GaAs, and other III-V group compounds such as InP or InGaAs having high carrier mobility, or Si may be used. As the semiconductor layer, an epitaxial growth layer having a carrier concentration of less than $10^{14}$ cm$^{-3}$ which is grown on the substrate may be used instead of the above-described substrate.

Figure 4:
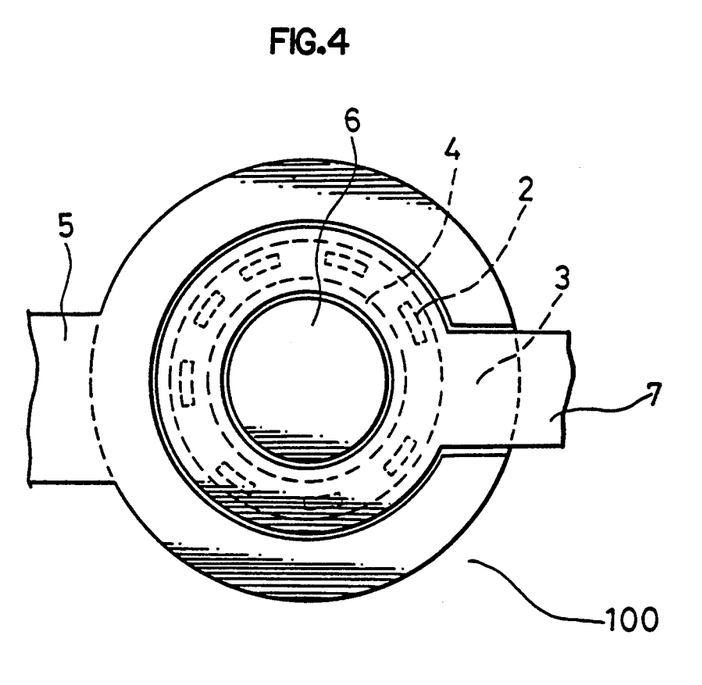
FIG. 4 is a diagram showing a plan view of a PBT according to a second embodiment of the present invention.

The plan arrangement of the source/drain layers and the gate electrode is not restricted to that shown in FIG. 1(a). Another arrangement is shown in FIG. 4. In FIG. 4, reference numeral 3 designates an annular source n+ region disposed in a semi-insulating semiconductor substrate 100. Buried gate buried 2 are inwardly spaced from the internal line boundary of the source n+ region 3. A cylindrical drain n+ region 4 is disposed inside the buried gate electrodes 2. Reference numerals 5 and 6 designate a source electrode and a drain electrode, respectively. In this second embodiment, the same advantages as those of the above-described first embodiment are achieved.

As is evident from the foregoing description, according to the present invention, since a source layer, a drain layer, and a gate electrode are arranged such that the channel current flows transverse to the substrate thickness, an epitaxial growth for producing a channel layer on the buried (base) gate electrode is unnecessary, thereby avoiding deterioration of the crystallinity of the channel layer. This results in a higher performance PBT having a high breakdown voltage and a superior ballistic conductivity.

What is claimed is:

1. A permeable base transistor comprising:
   a semi-insulating semiconductor layer having a thickness;
   doped source and drain regions highly doped relative to said layer spaced from and opposite each other in said semi-insulating semiconductor layer; and
   a buried metal gate electrode including at least one current permeable aperture disposed between said source and drain regions within said layer so that a channel current flowing between said source and drain regions flows through the aperture and transverse to the thickness of said semi-insulating semiconductor layer wherein said buried metal gate electrode includes a plurality of buried metal gate electrode fingers disposed along a circle in said semi-insulating semiconductor layer with predetermined intervals therebetween, and one of said drain and source regions comprises a cylindrical region disposed inwardly from said buried metal gate electrode fingers and the other of said source and drain regions comprises an annular region disposed outwardly from and surrounding said buried metal gate electrode fingers.

2. A permeable base transistor as defined in claim 1 wherein said buried metal gate electrode includes said plurality of buried metal gate electrode fingers disposed along a circumference of several hundreds of microns with an interval of about 0.1 to 10 microns between adjacent gate electrode fingers and the gate length is less than 0.5 micron.

3. A permeable base transistor as defined in claim 1 including a gate contacting electrode electrically connected to said plurality of buried gate electrode fingers.

4. A permeable base transistor as defined in claim 3 wherein said gate contacting electrode is not in contact with said layer.

5. A permeable base transistor comprising:
   a semi-insulating semiconductor bulk crystal substrate having a thickness;
   source and drain regions highly doped relative to said bulk crystal substrate spaced from and opposite each other in said semi-insulating semiconductor bulk crystal substrate;
   a semiconductor gate having a gate length less than 0.5 micron and a low resistance relative to said bulk crystal substrate comprising a plurality of gate fingers disposed along a straight line several hundreds of microns in length with a predetermined interval of about 0.1 to 10 microns between adjacent gate fingers, said gate fingers being disposed within said bulk crystal substrate between said source and drain regions including at least one current permeable aperture so that a channel current flowing between said source and drain regions flows through the aperture and transverse to the thickness of said semi-insulating semiconductor bulk crystal substrate; and
   a gate contacting electrode electrically contacting said gate and spaced from said bulk crystal substrate.

6. A permeable base transistor as defined in claim 5 wherein said semi-insulating semiconductor bulk crystal substrate is GaAs.

7. A permeable base transistor as defined in claim 5 wherein said semi-insulating semiconductor bulk crystal substrate is chosen from the group of semiconductors consisting of III-V semiconducting compounds and Si.

8. A permeable base transistor comprising:
   a semi-insulating semiconductor layer having a thickness;
   source and drain regions highly doped relative to said layer spaced from and opposite each other in said semi-insulating semiconductor layer; and
   a buried metal gate electrode including at least one current permeable aperture disposed between said source and drain regions within said layer so that a channel current flowing between said source and drain regions flows through the aperture and transverse to the thickness of said semi-insulating semiconductor layer wherein said buried metal gate electrode comprises a plurality of buried metal gate electrode fingers buried in said layer and disposed in a straight line with predetermined intervals therebetween along a length of several hundred microns with an interval of about 0.1 to 10 microns between adjacent buried metal gate electrode fingers and the gate length is less than 0.5 micron.

9. A permeable base transistor as defined in claim 8 including a gate contacting electrode electrically connected to said plurality of buried gate electrode fingers.

10. A permeable base transistor as defined in claim 9 wherein said gate contacting electrode is not in contact with said layer.

11. A permeable base transistor as defined in claim 8 wherein said semi-insulating semiconductor layer is a bulk crystal GaAs substrate.

12. A permeable base transistor as defined in claim 8 wherein said semi-insulating semiconductor layer is a bulk crystal substrate chosen from the group of semiconductors consisting of III-V semiconductor compounds and Si.

13. A permeable base transistor as defined in claim 8 wherein said semi-insulating semiconductor layer comprises an epitaxial layer having an impurity concentration of less than $10^{14}$ cm$^{-3}$ which is disposed on a semi-insulating GaAs substrate.

14. A permeable base transistor comprising:
   a semi-insulating semiconductor bulk crystal substrate having a thickness;
   source and drain regions highly doped relative to said bulk crystal substrate spaced from and opposite each other in said semi-insulating semiconductor bulk crystal substrate;

a semiconductor gate having a low resistance relative to said bulk crystal substrate comprising a plurality of gate fingers disposed along a circle within said bulk crystal substrate with predetermined intervals therebetween and between said source and drain regions, one of said source and drain regions comprising a cylindrical region disposed inwardly from said gate fingers and the other of said drain and source regions comprising an annular region disposed outwardly from and surrounding said gate fingers, said gate fingers including at least one current permeable aperture so that a channel current flowing between said source and drain regions flows through the aperture and transverse to the thickness of said semi-insulating semiconductor bulk crystal substrate; and a gate contacting electrode electrically contacting said gate and spaced from said bulk crystal substrate.

15. A permeable base transistor as defined in claim 14 wherein said plurality of gate fingers are disposed along a circumference of several hundreds of microns with an interval of about 0.1 to 10 microns between adjacentt gate fingers and the gate length is less than 0.5 micron.

* * * * *